United States Patent
Ogaki et al.

(10) Patent No.: US 8,740,506 B2
(45) Date of Patent: Jun. 3, 2014

(54) POSITIONING APPARATUS

(75) Inventors: Shogo Ogaki, Aikoh-gun (JP); Takashi Ando, Aikoh-gun (JP); Masaru Inoue, Aikoh-gun (JP); Takeshi Shimoda, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 625 days.

(21) Appl. No.: 13/033,253

(22) Filed: Feb. 23, 2011

(65) Prior Publication Data
US 2011/0222971 A1  Sep. 15, 2011

(30) Foreign Application Priority Data
Mar. 10, 2010  (JP) ................ P2010-053486

(51) Int. Cl.
*B65G 51/20* (2006.01)
(52) U.S. Cl.
USPC .............................. 406/83; 406/88; 108/50.13
(58) Field of Classification Search
USPC ................... 406/83, 88; 414/676; 108/50.13; 248/631
See application file for complete search history.

(56) References Cited

U.S. PATENT DOCUMENTS

| | | | |
|---|---|---|---|
| 3,614,168 A * | 10/1971 | Range | 406/2 |
| 3,890,508 A | 6/1975 | Sharp | |
| 3,976,330 A * | 8/1976 | Babinski et al. | 406/84 |
| 4,299,518 A * | 11/1981 | Whelan | 406/62 |
| 4,609,001 A * | 9/1986 | Noh et al. | 134/62 |
| 4,717,263 A * | 1/1988 | Phillips | 384/12 |
| RE32,684 E | 5/1988 | Lenhart | |
| 4,807,739 A | 2/1989 | Wolf et al. | |
| 4,865,491 A * | 9/1989 | Sakurai | 406/87 |
| 5,017,052 A * | 5/1991 | Bartylla | 406/88 |
| 5,226,758 A * | 7/1993 | Tanaka et al. | 406/86 |
| 5,451,125 A * | 9/1995 | Lenhart | 406/88 |
| 5,518,545 A | 5/1996 | Miyano | |
| 5,800,118 A * | 9/1998 | Kurome et al. | 414/676 |
| 6,354,789 B2 * | 3/2002 | Takeuchi et al. | 414/676 |
| 6,409,434 B1 | 6/2002 | Winther | |
| 7,513,716 B2 * | 4/2009 | Hayashi et al. | 406/88 |
| 7,556,246 B2 | 7/2009 | Suzuki | |
| 7,624,661 B2 * | 12/2009 | Umetsu et al. | 74/490.08 |
| 7,908,995 B2 * | 3/2011 | Inamasu et al. | 118/300 |
| 7,997,289 B1 * | 8/2011 | Frost et al. | 134/137 |
| 2002/0182047 A1 | 12/2002 | Adam et al. | |
| 2008/0069677 A1 | 3/2008 | Kawachi et al. | |
| 2009/0274523 A1 * | 11/2009 | Li et al. | 406/4 |
| 2010/0247308 A1 * | 9/2010 | Giacchi et al. | 415/229 |
| 2011/0214982 A1 * | 9/2011 | Hagen | 204/157.15 |
| 2011/0222971 A1 | 9/2011 | Ogaki et al. | |
| 2013/0047728 A1 * | 2/2013 | Cochran et al. | 73/570.5 |

FOREIGN PATENT DOCUMENTS

| | | |
|---|---|---|
| JP | 58-178000 | 11/1983 |
| JP | 1-303788 | 12/1989 |
| JP | 2-17794 | 5/1990 |

(Continued)

*Primary Examiner* — Joseph Dillon, Jr.
(74) *Attorney, Agent, or Firm* — Jordan and Hamburg LLP (57) ABSTRACT

A positioning apparatus includes a stage on which a piezoelectric element is set, a stop unit having a stop face to which the piezoelectric element set on the stage is pushed so that the piezoelectric element is positioned at a target position corresponding to an attaching part of, for example, a head suspension to which the piezoelectric element is attached, and a pushing unit to push the piezoelectric element toward the stop face, the pushing unit blowing a gas to push the piezoelectric element. The positioning apparatus is capable of correctly positioning the piezoelectric element to the target position without damaging the piezoelectric element.

11 Claims, 8 Drawing Sheets

(56) References Cited

FOREIGN PATENT DOCUMENTS

| JP | 2-151099 | 6/1990 |
| JP | 4-282408 | 10/1992 |
| JP | 5-47520 | 12/1993 |
| JP | 5-86078 | 12/1993 |
| JP | 6-255843 | 9/1994 |
| JP | 2002-050140 | 2/2002 |
| JP | 2008-112901 | 5/2008 |

* cited by examiner

POSITIONING APPARATUS

BACKGROUND OF THE INVENTION

1. Field of the Invention

The present invention relates to a positioning apparatus for positioning a plate-like object such as a piezoelectric element to a target position corresponding to, for example, an attaching part of a head suspension to which the plate-like object is attached.

2. Description of Related Art

Japanese Unexamined Patent Application Publication No. 2002-050140 discloses a plate-like piezoelectric element to be attached to a dual-actuator-type head suspension that is installed in a hard disk drive.

Attached to the head suspension, the piezoelectric element works to minutely move a magnetic head arranged at a front end of the head suspension so that the magnetic head is precisely positioned to a target location on a hard disk of the hard disk drive. With the piezoelectric element, the head suspension realizes an improved magnetic head positioning accuracy to handle even a very-high-density hard disk.

To realize a required magnetic head positioning accuracy, the piezoelectric element must precisely be attached to the head suspension. If the piezoelectric element on the head suspension involves a positioning error, the magnetic head of the head suspension will cause a stroke error. The piezoelectric element, therefore, must correctly be positioned and fixed to a piezoelectric element attaching part of the head suspension.

For this, the piezoelectric element is positioned to a target position that corresponds to the attaching part of the head suspension and is attached to the attaching part with the positioned state of the piezoelectric element being maintained.

A technique of positioning an object to a target position is disclosed in Japanese Unexamined Patent Application Publication No. 2008-112901. This related art is a positioning apparatus having a pushing plate and a reference plate. The related art pushes a piezoelectric element with the pushing plate to the reference plate so that the piezoelectric element is positioned to a target position and clamps the piezoelectric element at the target position.

At this time, the piezoelectric element will crack or chip if it involves shape variations and if it is tightly clamped between the pushing plate and the reference plate.

To avoid this, the related art must loosely clamp the piezoelectric element at the target position. This, however, results in losing positioning accuracy and reliability of the positioned piezoelectric element.

In addition, even if the clamping force is reduced, it is unable to eliminate a risk of damaging the piezoelectric element.

SUMMARY OF THE INVENTION

An object of the present invention is to provide a positioning apparatus capable of positioning a plate-like object to a target position without damaging the plate-like object.

In order to accomplish the object, an aspect of the present invention provides a positioning apparatus including a stage on which a plate-like object is set, a stop unit receiving the plate-like object set on the stage in a planar direction of the plate-like object so that the plate-like object is positioned at a target position corresponding to an attaching part to which the plate-like object is attached, and a pushing unit configured to push the plate-like object toward the stop unit in the planar direction, the pushing unit blowing a gas to push the plate-like object.

According to this aspect of the present invention, the pushing unit blows a gas such as air to the plate-like object, thereby pushing the plate-like object to the stop unit in the planar direction and surely positioning the plate-like object at the target position without damaging the plate-like object.

BRIEF DESCRIPTION OF THE DRAWINGS

FIGS. 6A and 6B are plan views illustrating a positioning apparatus according to a third embodiment of the present invention in which

FIGS. 7A to 7C are plan views illustrating a positioning apparatus according to a fourth embodiment of the present invention in which

FIGS. 13A and 13B are plan views illustrating a positioning apparatus according to a ninth embodiment of the present invention in which

DETAILED DESCRIPTION OF EMBODIMENTS

Positioning apparatuses according to embodiments of the present invention will be explained in detail with reference to the drawings. Each embodiment blows a gas to a plate-like object to surely position the plate-like object to a target position without damaging the plate-like object.

Figure 1:
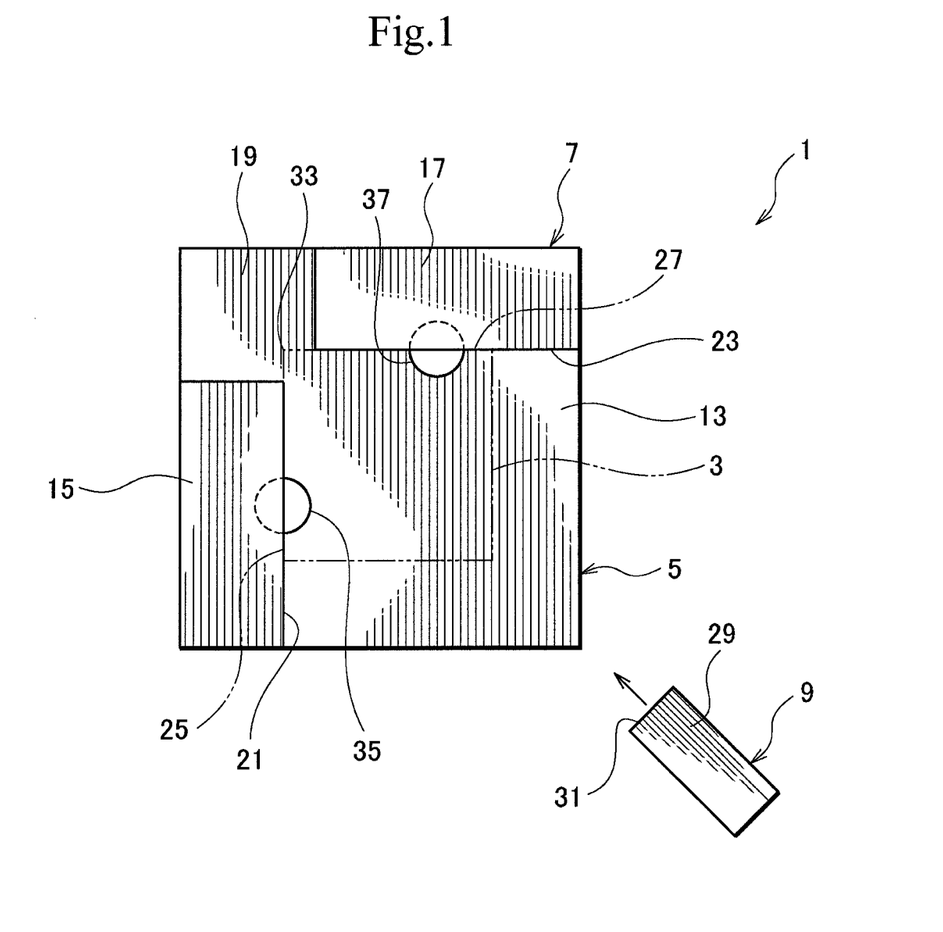
FIG. 1 is a plan view illustrating a positioning apparatus according to a first embodiment of the present invention.
Figure 2A:
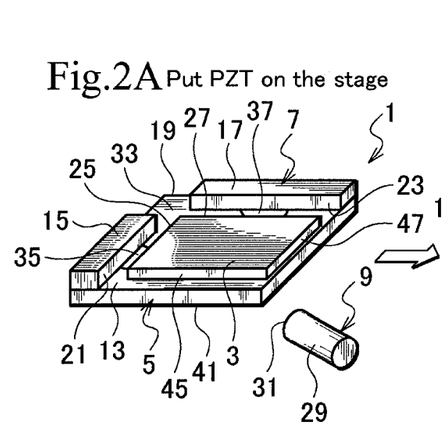
FIGS. 2A to 2F are perspective views illustrating positioning operation of the positioning apparatus according to the first embodiment.
Figure 2B:
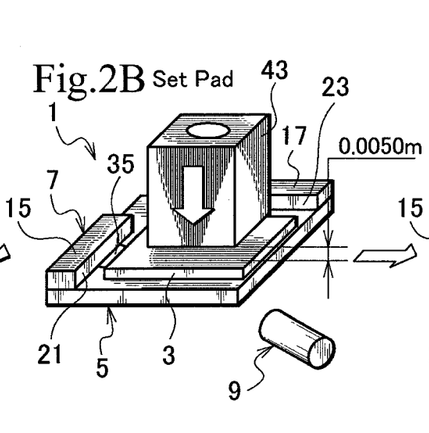
Figure 2C:
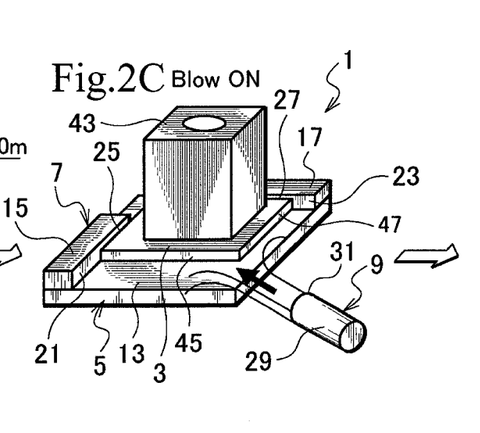
Figure 2D:
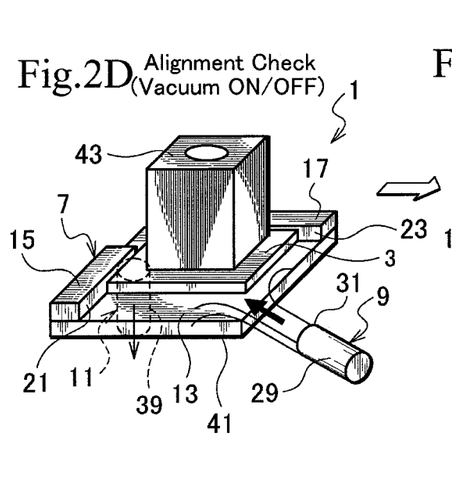
Figure 2E:
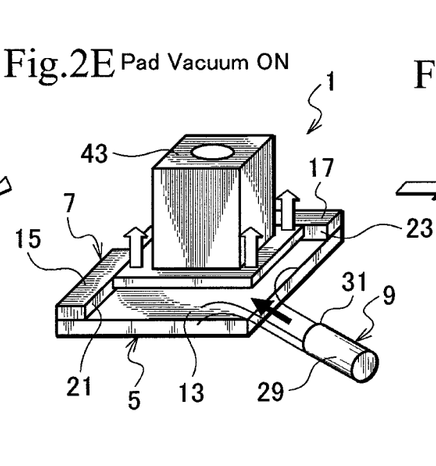
Figure 2F:
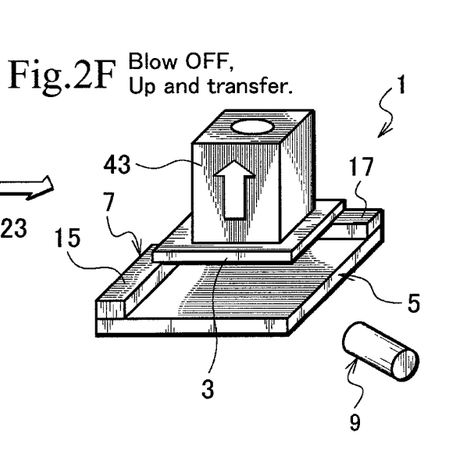
Figure 3:
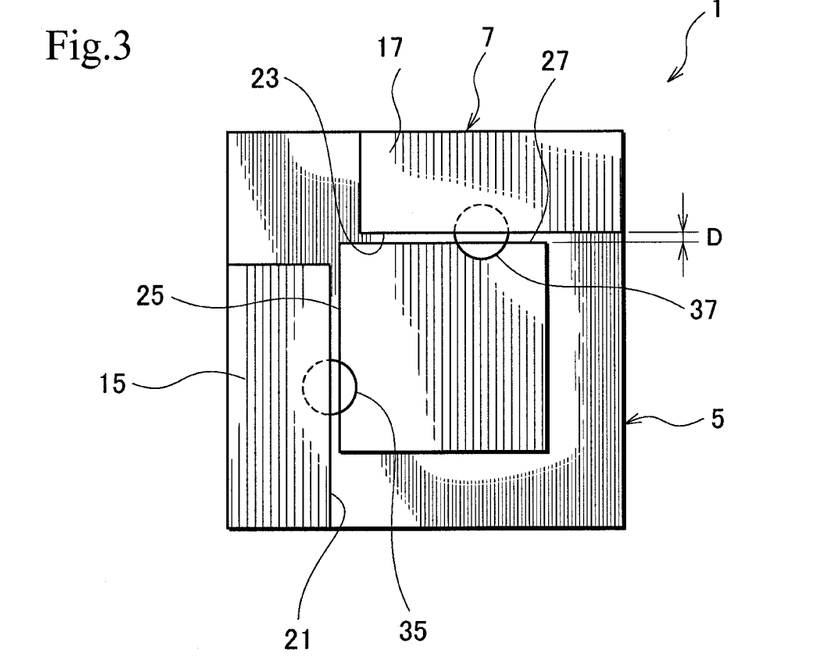
FIG. 3 is a plan view illustrating a clearance to test a positioning state according to the first embodiment.
Figure 4:
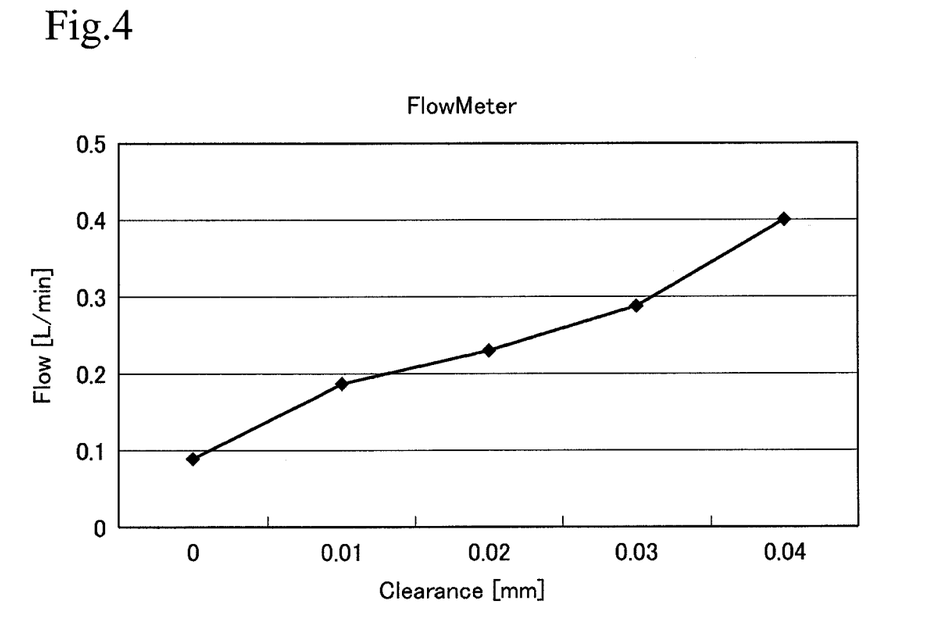
FIG. 4 is a graph illustrating a relationship between clearance and flow rate according to the first embodiment.

A positioning apparatus according to a first embodiment of the present invention will be explained with reference to FIGS. 1 to 4 in which FIG. 1 is a plan view illustrating the positioning apparatus, FIGS. 2A to 2F are perspective views illustrating positioning operation of the positioning apparatus, FIG. 3 is a plan view illustrating a clearance to test a positioning state, and FIG. 4 is a graph illustrating a relationship between clearance and flow rate.

The positioning apparatus 1 according to the first embodiment (or any one of the below-mentioned embodiments) is used to manufacture, for example, a dual-actuator-type head suspension to be installed in a hard disk drive. For example, the positioning apparatus 1 is used to position a piezoelectric element (plate-like object) 3 to a target position corresponding to an attaching part of the head suspension to which the piezoelectric element 3 is attached.

The piezoelectric element 3 is made of piezoelectric ceramics such as lead zirconium titanate (PZT) and has a plate-like shape with a quadrangle surface. That is, the piezoelectric element 3 is quadrangle in the plan view. According to the embodiment, the piezoelectric element 3 has a square surface of about 1 to 2 mm in side length and a thickness of about 0.1 mm. Namely, each side of the piezoelectric element 3 has a length of millimeters and the thickness thereof is less than 1/10 of the side length. The piezoelectric element 3 may have a side length in the range of about 0.1 to 3.5 mm and a thickness in the range of about 0.02 to 0.15 mm with a side length-thickness ratio properly determined.

The positioning apparatus 1 is applicable not only to the piezoelectric element but also to other small and thin plate-like objects. The piezoelectric element 3 may have an optional planar shape such as a rectangle.

The positioning apparatus 1 includes a stage 5, a stop unit 7, a pushing unit 9, and a position tester 11 as illustrated in FIGS. 1 and 2.

According to the embodiment, the stage 5 is a flat quadrangular plate. The stage 5 may be a plate having any other shape such as a circular shape. A surface 13 of the stage 5 is flat to place the piezoelectric element 3 thereon. The surface 13 of the stage 5 is provided with the stop unit 7.

The stop unit 7 is configured to receive the piezoelectric element 3 in a planar direction of the piezoelectric element 3 and includes stoppers 15 and 17. The stoppers 15 and 17 are rectangular parallelepipeds and are arranged along adjacent two sides of the stage 5, respectively. The stoppers 15 and 17 extend along directions crossing or orthogonal to each other. Between ends of the stoppers 15 and 17, there is a gap 19. Inward faces of the stoppers 15 and 17 serve as stop faces 21 and 23 with respect to corresponding faces of the piezoelectric element 3.

Stop faces 21 and 23 are orthogonal to each other and correspond to adjacent two end faces 25 and 27 of the piezoelectric element 3, respectively. The stop faces 21 and 23 are aligned with respect to an attaching part of a head suspension to which the piezoelectric element 3 is attached.

The stop faces 21 and 23 are configured to position the piezoelectric element 3 to a target position, i.e., the attaching part of the head suspension when the end faces 25 and 27 of the piezoelectric element 3 are brought in contact with the stop faces 21 and 23 in the planar direction of the piezoelectric element 3. The planar direction is a direction parallel with the surface of the piezoelectric element 3.

The stoppers 15 and 17 may have any shape if the stop faces 21 and 23 thereof properly stop the end faces 25 and 27 of the piezoelectric element 3. For example, the stoppers 15 and 17 may each have a circular side face, i.e., the stop faces 21 and 23 may each be curved. In this case, the end faces 25 and 27 of the piezoelectric element 3 each make a point contact with respect to the stop faces 21 and 23.

According to the embodiment, the stop faces 21 and 23 are longer than the corresponding end faces 25 and 27 of the piezoelectric element 3. The stop faces 21 and 23 may be shorter than the corresponding end faces 25 and 27.

The pushing unit 9 has a nozzle 29 to blow gas (air) to push the piezoelectric element 3. The nozzle 29 is cylindrical and is movable back and forth in an axial direction. A center axis of the nozzle 29 is along with the planar direction in parallel with the surface of the piezoelectric element 3 and is inclined by about 45° with respect to the stop faces 21 and 23 of the stop unit 7 in the plan view. A front end of the nozzle 29 is a nozzle opening 31.

The nozzle opening 31 is oriented toward a corner 33 between the stop faces 21 and 23 of the stop unit 7. Due to the orientation of the nozzle 29, the direction of air blown from the nozzle opening 31 is inclined by about 45° with respect to the stop faces 21 and 23. Namely, the direction of the blown air is along a diagonal of the piezoelectric element 3.

The direction of air blown from the nozzle 29 is changed depending on the planar shape of the piezoelectric element 3 so that the direction of the blown air may agree with a diagonal of the planar shape of the piezoelectric element 3. The nozzle 29 may have an optional shape if it secures an air passage and a nozzle opening to blow air.

The pushing unit 9 is controlled by a controller (not illustrated) that controls back and forth movements of the nozzle 29 and a flow rate of air to be blown from the nozzle 29, thereby controlling force applied by the air to the piezoelectric element 3.

The position tester 11 includes plural through holes 35 and 37 and a flow measurement unit 39. According to the embodiment, the position tester 11 has the two through holes 35 and 37.

The through holes 35 and 37 are formed through the stage 5. The through holes 35 and 37 are closed with the piezoelectric element 3 when the piezoelectric 3 is positioned at the target position. Each of the through holes 35 and 37 has a circular section and a diameter shorter than a side length of the piezoelectric element 3. For example, the diameter of each of the through holes 35 and 37 is about 0.5 mm. The through holes 35 and 37 may have any other sectional shape such as a polygon.

The through holes 35 and 37 are partly covered by the stoppers 15 and 17 in a thickness direction of the stage 5 that is a drawing direction of the flow measurement unit 39 to be explained later, respectively. Namely, an opening of the through hole 35 (37) protrudes from the stop face 21 (23) of the stopper 15 (17) in a direction crossing an extending direction of the stop face 21 in the plan view such that it gradually becomes smaller. The area of the through hole 35 (37) covered by the stopper 15 (17) is optionally set.

According to the embodiment, the stoppers 15 and 17 cover about half of the openings of the through holes 35 and 37, so that the stop faces 21 and 23 of the stoppers 15 and 17 cross centers of the through holes 35 and 37, respectively. As a result, the opening of each of the through holes 35 and 37 on the surface 13 of the stage 5 is semicircular and has a maximum diameter along the corresponding one of the stop faces 21 and 23.

The plural through holes 35 and 37 are arranged along the stop faces 21 and 23. When the piezoelectric element 3 is properly positioned, the through holes 35 and 37 are on the outer sides of the center of the piezoelectric element 3 in the extending directions of corresponding stop faces 21 and 23, respectively.

The flow measurement unit 39 is connected to the through holes 35 and 37 at a bottom face 41 of the stage 5. The flow measurement unit 39 draws air through the through holes 35 and 37 under the control of the controller, to attract the piezoelectric element 3 positioned on the stage 5.

The flow measurement unit 39 includes a flowmeter (not illustrated) to measure a flow rate of the drawn air and supply the measured flow rate to the controller. According to the measured flow rate, the controller determines a positioning state of the piezoelectric element 3.

As illustrated in FIGS. 2A to 2F, the positioning apparatus 1 positions the piezoelectric element 3 to the target position on the stage 5, and thereafter, tests the positioned state of the piezoelectric element 3.

In FIG. 2A, the piezoelectric element 3 is placed on the stage 5 of the positioning apparatus 1. At this time, the piezoelectric element 3 is roughly positioned on the stage 5. In FIG. 2B, a carrier pad 43 is set on the piezoelectric element 3 with a slight gap of 0.005 mm being present between a front end of the carrier pad 43 and the surface of the piezoelectric element 3. The carrier pad 43 is used to pick up the piezoelectric element 3 and carry the same without breaking the positioned state of the piezoelectric element 3.

In FIG. 2C, the nozzle 29 of the pushing unit 9 blows air toward the piezoelectric element 3. Due to the direction of the nozzle 29, the blown air hits adjacent two end faces 45 and 47 of the piezoelectric element 3 and the piezoelectric element 3 on the stage 5 is pushed toward the stop faces 21 and 23 of the stop unit 7.

The piezoelectric element 3 slides and comes in contact with the stop faces 21 and 23 of the stop unit 7 in the planar direction. At this time, the air from the pushing unit 9 enters under the piezoelectric element 3. As a result, the piezoelectric element 3 slightly floats from the stage 5, so that the piezoelectric element 3 smoothly moves and comes in contact with the stop faces 21 and 23.

When the piezoelectric element 3 slides along the stage 5, the nozzle 29 of the pushing unit 9 may be advanced and/or an air flow rate from the nozzle 29 may be increased, to keep the force pushing the piezoelectric element 3 and smoothly shift the same to the stop faces 21 and 23.

In the consequence, the piezoelectric element 3 is pushed to the stop faces 21 and 23 of the stop unit 7 in the planar direction and is positioned at the target position corresponding to the attaching part of the head suspension.

Once the piezoelectric element 3 comes in contact with the stop faces 21 and 23, the position tester 11 tests a positioning state of the piezoelectric element 3. In FIG. 2D, the flow measurement unit 39 draws air from under the piezoelectric element 3 and measures a flow rate of the drawn air. According to the measured flow rate, the position tester 11 determines a positioning state of the piezoelectric element 3.

The flow rate measured by the flow measurement unit 39 is dependent on a clearance D (FIG. 3) between the stop faces 21 and 23 of the stop unit 7 and the end faces 25 and 27 of the piezoelectric element 3. As the clearance D increases, the openings of the through holes 35 and 37 widen to increase the flow rate measured by the flow measurement unit 39.

As illustrated in FIG. 4, the clearance D and flow rate have a positive correlation that if one increases the other increases. The graph of FIG. 4 plots clearances D of 0 mm, 0.01 mm, 0.02 mm, 0.03 mm, and 0.04 mm and corresponding flow rates.

Based on such a correlation, the controller (not illustrated) determines whether or not the clearance D corresponding to the measured flow rate is within an allowable range. Values that define the allowable range are set according to a positioning accuracy required for the head suspension.

If the clearance D is within the allowable range, the flow measurement unit 39 stops drawing air and the carrier pad 43 holds and lifts the piezoelectric element 3 as illustrated in FIG. 2E. At this time, the stop faces 21 and 23 guide the piezoelectric element 3 to be lifted. The pushing unit 9 stops blowing air and the piezoelectric element 3 kept in the positioned state is carried to the attaching part of the head suspension, as illustrated in FIG. 2F.

If the clearance D is out of the allowable range, the above-mentioned positioning operation and testing operation are repeated until the clearance D falls within the allowable range.

Effect of the first embodiment will be explained.

The positioning apparatus 1 according to the first embodiment of the present invention includes the stage 5 on which the piezoelectric element 3 is placed, the stop unit 7 receiving the piezoelectric element 3 placed on the stage 5 in the planar direction to position the piezoelectric element to a target position corresponding to an attaching part of a head suspension to which the piezoelectric element 3 is attached, and the pushing unit 9 to push the piezoelectric element 3 in the planar direction so that the piezoelectric element 3 comes in contact with the stop unit 7. The pushing unit 9 blows air toward the piezoelectric element 3, thereby pushing the piezoelectric element 3 to the target position.

With this configuration, the positioning apparatus 1 brings the piezoelectric element 3 in contact with the stop unit 7. At this time, the pushing unit 9 blows air to the piezoelectric element 3 so that the piezoelectric element 3 is surely positioned to the target position without clamping the piezoelectric element 3.

The positioning apparatus 1 never directly clamps the piezoelectric element 3, and therefore, the piezoelectric element 3 receives no destructive shock or force even if the piezoelectric element 3 involves shape variations. Accordingly, the piezoelectric element 3 never cracks or chips during the positioning operation.

According to the related art that pushes or clamps a piezoelectric element with a solid tool, the piezoelectric element must precisely be formed to minimize shape variations and must carefully be handled during the positioning operation to avoid cracks or chipping. On the other hand, the positioning apparatus 1 according to the embodiment pushes the piezoelectric element 3 by blowing air to the same, thereby relaxing the requirements for such precision forming and careful handling. The positioning apparatus 1, therefore, is capable of easily and correctly positioning the piezoelectric element 3 without damaging the same.

Air blown out of the pushing unit 9 also enters under the piezoelectric element 3, to slightly float the piezoelectric element 3 from the stage 5 and smoothly move the same up to the stop unit 7.

According to the embodiment, the stop unit 7 includes the stop faces 21 and 23 to receive the end faces 25 and 27 of the piezoelectric element 3 and surely position the piezoelectric element 3 to the target position.

According to the embodiment, the pushing unit 9 has the nozzle opening 31 to blow air toward the corner 33 between the stop faces 21 and 23 of the stop unit 7, so that the piezoelectric element 3 is surely pushed to the stop faces 21 and 23. Although the nozzle opening 31 is single, it sufficiently pushes and positions the piezoelectric element 3.

The single nozzle opening 31 blows air along a diagonal of the piezoelectric element 3, to surely push the piezoelectric element 3 toward the stop faces 21 and 23.

According to the embodiment, the piezoelectric element 3 has a square surface and the nozzle opening 31 is inclined by 45° relative to the stop faces 21 and 23. The single nozzle opening 31, therefore, surely pushes the piezoelectric element 3 toward the stop faces 21 and 23.

According to the embodiment, the nozzle 29 of the pushing unit 9 is advanced or a flow rate of air blown from the nozzle 29 is increased, if required to maintain pushing force applied to the piezoelectric element 3 and smoothly push the piezoelectric element 3 to the stop faces 21 and 23.

According to the embodiment, the stage 5 is provided with the through holes 35 and 37 through which the flow measurement unit 39 draws air from under the piezoelectric element 3. According to a flow rate measured by the flow measurement unit 39, a positioning state of the piezoelectric element 3 is determined.

Although the piezoelectric element 3 is small, light, and thin, the flow measurement unit 39 easily and surely tests a positioning state of the piezoelectric element 3 without scattering of the piezoelectric element 3 or shifting the position of the piezoelectric element 3 on the stage 5 due to drawing air.

The plural through holes 35 and 37 are arranged along stop faces 21 and 23, to increase a flow rate difference. This allows threshold values that define a positioning allowable range to be set precisely and the position of the piezoelectric element 3 to be tested accurately.

The through holes 35 and 37 protrude from the stop faces 21 and 23 in the directions crossing the extending directions of the stop faces 21 in such a way as to decrease the sectional shapes of the through holes 35 and 37 in directions parting from the stop faces 21 and 23. This configuration increases a flow rate difference or sensitivity with respect to a change in the clearance D between the stop unit 7 and the piezoelectric element 3. The positioning apparatus 1, therefore, can precisely determine a positioning state of the piezoelectric element 3.

According to the embodiment, the opening of each of the through holes 35 and 37 is semicircular, and therefore, a maximum diameter part of the opening is positioned within the clearance D. This configuration increases a flow rate difference or sensitivity with respect to a very small difference in the clearance D.

Figure 5:
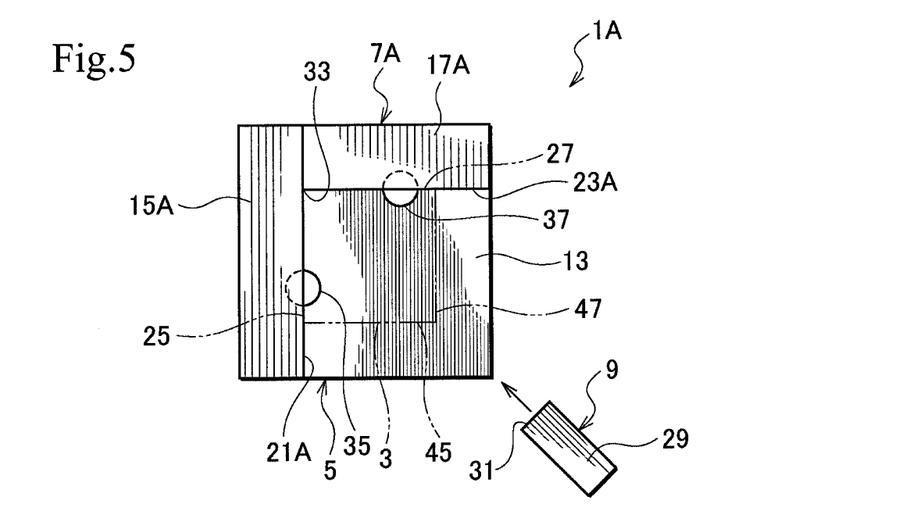
FIG. 5 is a plan view illustrating a positioning apparatus according to a second embodiment of the present invention.

A positioning apparatus 1A according to the second embodiment of the present invention will be explained with reference to FIG. 5. The second embodiment is basically the same as the first embodiment, and therefore, corresponding parts are represented with the same reference numerals, or the same reference numerals plus "A" to omit repetition of explanation.

The positioning apparatus 1A according to the second embodiment includes a stop unit 7A having stoppers 15A and 17A between which no gap is present. Namely, an end of the stopper 15A is extended and an end of the stopper 17A is in contact with the expended part of the stopper 15A. The stoppers 15A and 17A may be integral with each other.

The second embodiment provides the same effect as the first embodiment. A positioning apparatus 1B according to the third embodiment of the present invention will be explained with reference to FIGS. 6A and 6B. The third embodiment is basically the same as the second embodiment, and therefore, corresponding parts are represented with the same reference numerals, or the same reference numerals plus "B" to omit repetition of explanation.

Figure 6A:
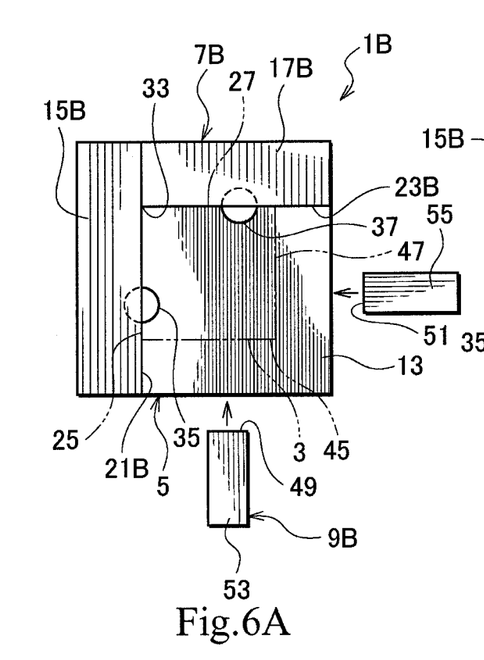
FIG. 6A illustrates a piezoelectric element after positioning and FIG. 6B the piezoelectric element before positioning.
Figure 6B:
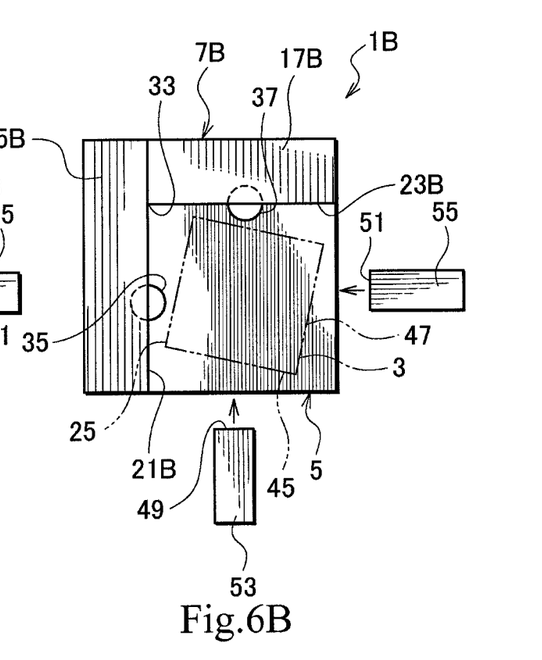

The positioning apparatus 1B according to the third embodiment employs, instead of the pushing unit 9 having the single nozzle opening 31, a pushing unit 9B having two nozzle openings 49 and 51.

More precisely, the pushing unit 9B has nozzles 53 and 55 that are arranged in directions of stop faces 21B and 23B of a stop unit 7B, respectively. The nozzles 53 and 55 have the nozzle openings 49 and 51 that are oriented toward the stop faces 23B and 21B, respectively, to blow air toward the stop faces 23B and 21B.

The third embodiment provides the same effect as the second embodiment. By adjusting air flow rates from the nozzle openings 49 and 51, the third embodiment can easily and finely adjust the position of a piezoelectric element 3.

Figure 7A:
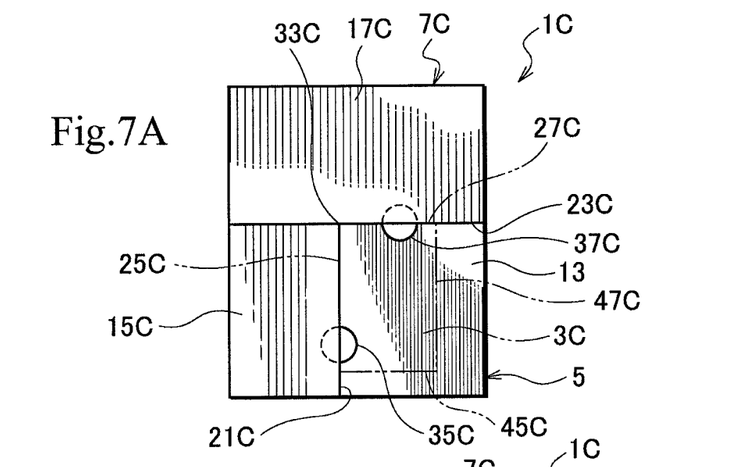
FIG. 7A illustrates a piezoelectric element after positioning, FIG. 7B the piezoelectric element before positioning, and FIG. 7C the piezoelectric element after positioning with a clearance.
Figure 7B:
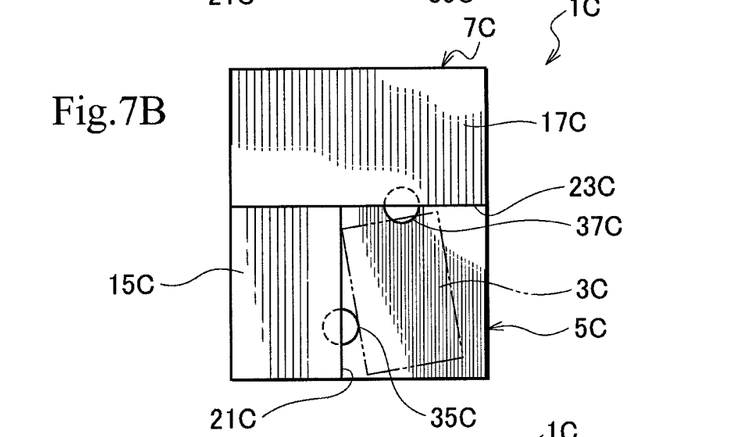
Figure 7C:
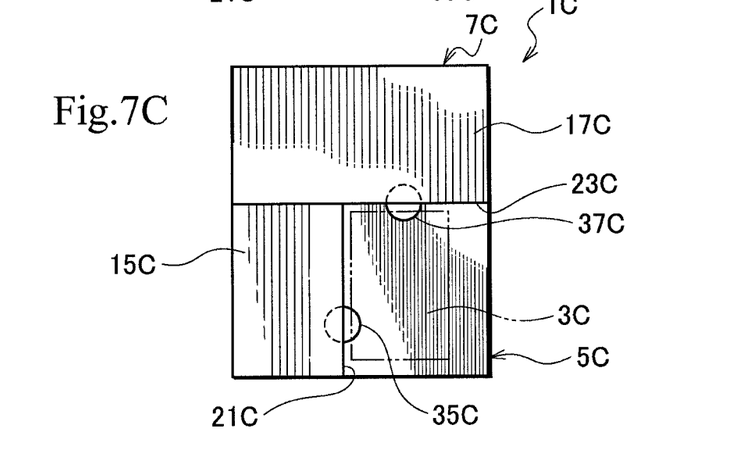

A positioning apparatus 1C according to the fourth embodiment of the present invention will be explained with reference to FIGS. 7A to 7C. The fourth embodiment is basically the same as the second embodiment, and therefore, corresponding parts are represented with the same reference numerals, or the same reference numerals plus "C" to omit repetition of explanation. Although not illustrated in FIGS. 7A to 7C, the fourth embodiment employs one of the pushing unit 9 and pushing unit 9B explained above.

The positioning apparatus 1C according to the fourth embodiment handles, instead of the square piezoelectric element 3, a piezoelectric element 3C having a rectangular surface.

Corresponding to short and long sides of the rectangular piezoelectric element 3C, the positioning apparatus 1C has through holes 35C and 37C at positions that are outwardly shifted from the center of the piezoelectric element 3C and are under edges of stop faces 21C and 23C of stoppers 15C and 17C of a stop unit 7C. According to the fourth embodiment, the stoppers 15C and 17C are wider than those of the preceding embodiments.

The fourth embodiment provides the same effect as the preceding embodiments.

Figure 8:
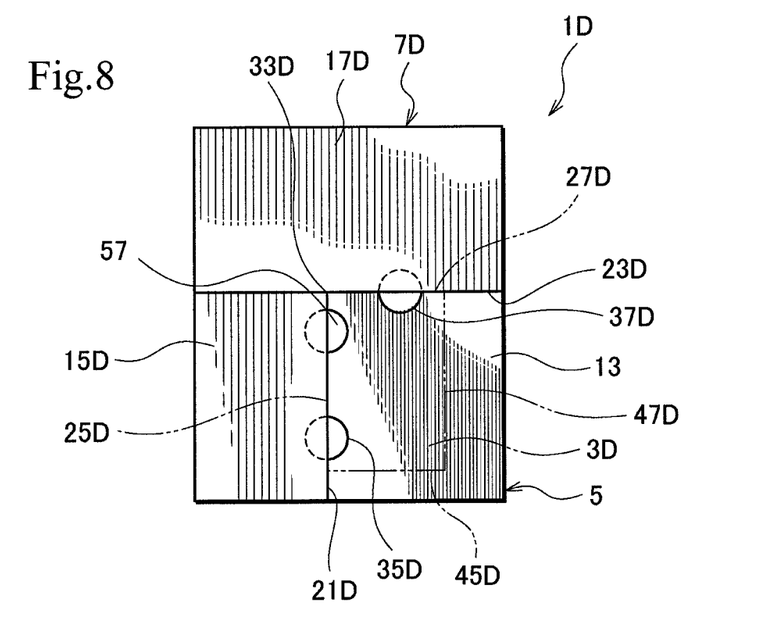
FIG. 8 is a plan view illustrating a positioning apparatus according to a fifth embodiment of the present invention.

A positioning apparatus 1D according to the fifth embodiment of the present invention will be explained with reference to FIG. 8. The fifth embodiment is basically the same as the fourth embodiment, and therefore, corresponding parts are represented with the same reference numerals, or the same reference numerals plus "D" to omit repetition of explanation.

The positioning apparatus 1D according to the fifth embodiment additionally forms a through hole 57 under an edge of a stop face 21D of a stop unit 7D. Namely, the fifth embodiment forms through holes 35D and 57 under the edge of the stop face 21D. The through holes 35D and 57 are outwardly and inwardly shifted from the center of a piezoelectric element 3D.

The fifth embodiment provides the same effect as the preceding embodiments. In addition, the additional through hole 57 helps increase a flow rate difference to be measured by the flow measurement unit 39 and helps precisely set thresholds that define a positioning allowable range, thereby improving the testing accuracy of a positioning state of the piezoelectric element 3D.

Figure 9:
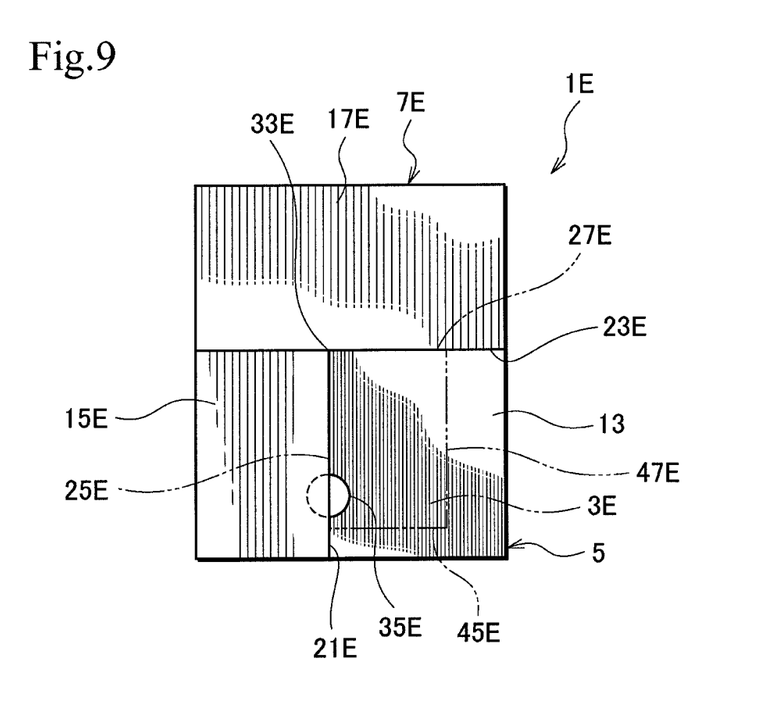
FIG. 9 is a plan view illustrating a positioning apparatus according to a sixth embodiment of the present invention.

A positioning apparatus 1E according to the sixth embodiment of the present invention and a modification thereof will be explained with reference to FIGS. 9 and 10. The sixth embodiment and the modification thereof are basically the same as the fourth embodiment, and therefore, corresponding parts are represented with the same reference numerals, or the same reference numerals plus "E" to omit repetition of explanation.

The positioning apparatus 1E according to the sixth embodiment forms only one through hole 35E under an edge of a stop face 21E of a stop unit 7E, the stop face 21E corresponding to a long side of a piezoelectric element 3E.

The sixth embodiment provides the same effect as the preceding embodiments.

Figure 10:
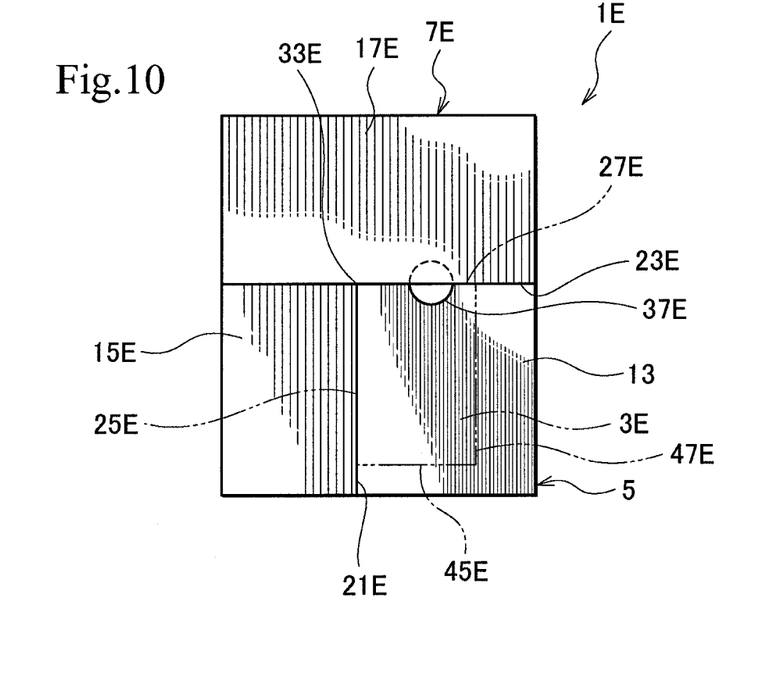
FIG. 10 is a plan view illustrating a positioning apparatus according to a modification of the sixth embodiment.

In FIG. 10, the modification of the sixth embodiment forms only one through hole 37E under an edge of a stop face 23E of the stop unit 7E, the stop face 23E corresponding to a short side of the piezoelectric element 3E.

Figure 11:
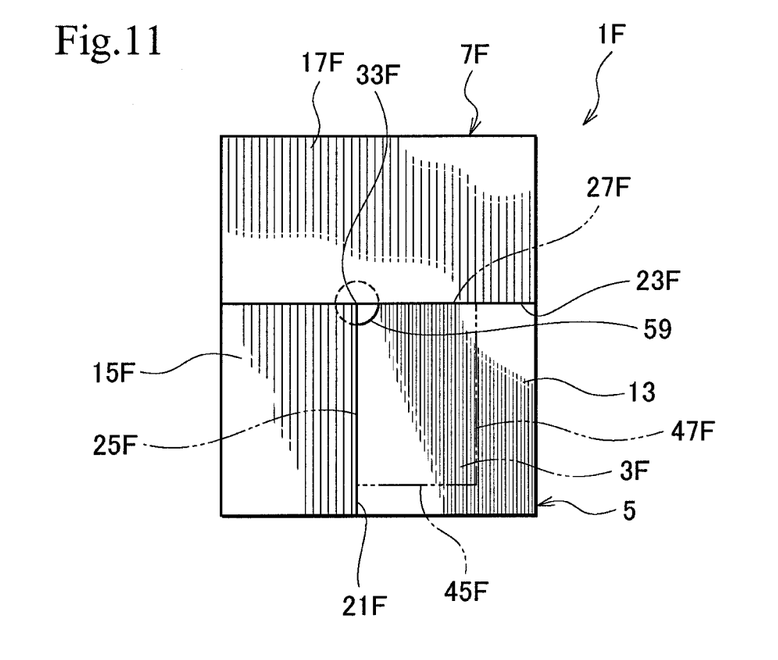
FIG. 11 is a plan view illustrating a positioning apparatus according to a seventh embodiment of the present invention.

A positioning apparatus 1F according to the seventh embodiment of the present invention will be explained with reference to FIG. 11. The seventh embodiment is basically the same as the fourth embodiment, and therefore, corresponding parts are represented with the same reference numerals, or the same reference numerals plus "F" to omit repetition of explanation.

The positioning apparatus 1F according to the seventh embodiment forms a single through hole 59 at a corner 33F between stop faces 21F and 23F of a stop unit 7F.

The through hole 59 is closed by about ¾ with stoppers 15F and 17F of the stop unit 7F and the stop faces 21F and 23F of the stoppers 15F and 17F pass over the center of the through hole 59. Accordingly, the through hole 59 opens in a quadrant at a surface 41F of a stage 5F.

The seventh embodiment provides the same effect as the preceding embodiments. In addition, the seventh embodiment produces, even with the single through hole 59, a large flow rate difference to be measured by the flow measurement unit 39.

Figure 12:
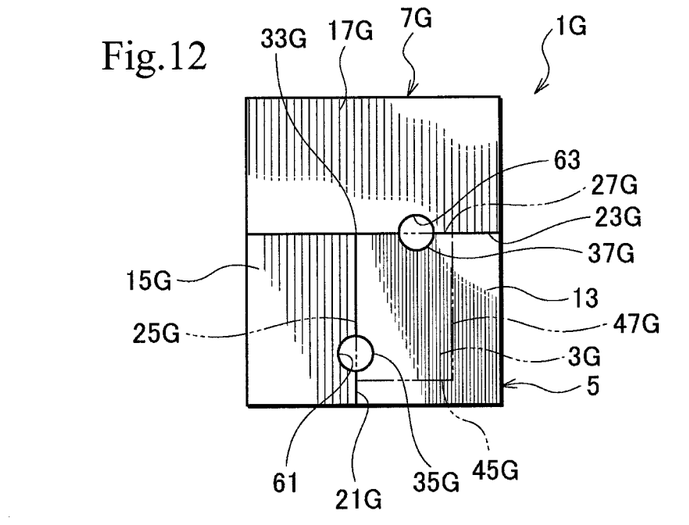
FIG. 12 is a plan view illustrating a positioning apparatus according to an eighth embodiment of the present invention.

A positioning apparatus 1G according to the eighth embodiment of the present invention will be explained with reference to FIG. 12. The eighth embodiment is basically the same as the fourth embodiment, and therefore, corresponding parts are represented with the same reference numerals, or the same reference numerals plus "G" to omit repetition of explanation.

The positioning apparatus 1G according to the eighth embodiment fully opens circular openings of through holes 35G and 37G.

For this, stoppers 15G and 17G of a stop unit 7G have recesses 61 and 63 corresponding to the through holes 35G and 37G. The recesses 61 and 63 have each a semicircular section and are recessed in thickness directions of the stoppers 15G and 17G, to fully open the circular openings of the through holes 35G and 37G at the surface of a stage 5G.

The eighth embodiment provides the same effect as the preceding embodiments. In addition, the eighth embodiment allows the through holes 35G and 37G to half open even when a piezoelectric element 3G completely comes in contact with the stop unit 7G.

Accordingly, the eighth embodiment secures a flow rate to be measured by the flow measurement unit 39 even when a clearance D between stop faces 21G and 23G of the stop unit 7G and the piezoelectric element 3G is nearly zero. This results in improving a linear correlation between clearance D and flow rate, to accurately test a positioning state of the piezoelectric element 3G.

Figure 13A:
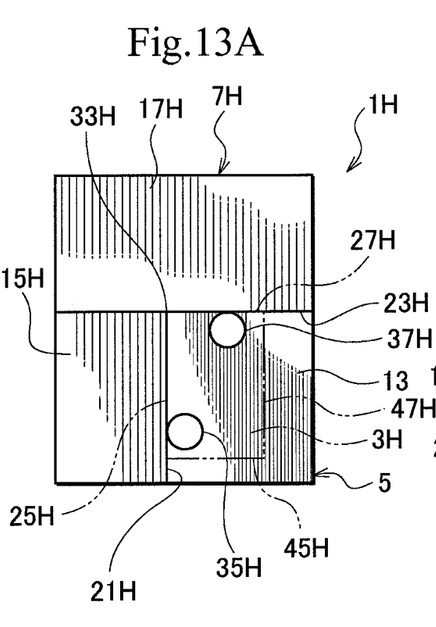
FIG. 13A illustrates a piezoelectric element after positioning and FIG. 13B the piezoelectric element after positioning with a clearance.
Figure 13B:
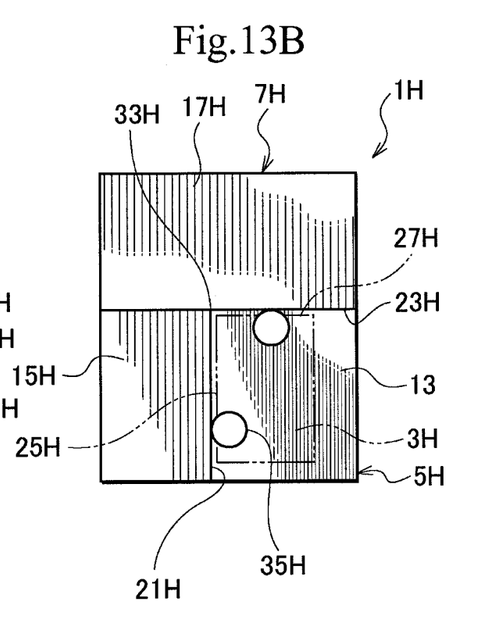

A positioning apparatus 1H according to the ninth embodiment of the present invention will be explained with reference to FIGS. 13A and 13B. The ninth embodiment is basically the same as the fourth embodiment, and therefore, corresponding parts are represented with the same reference numerals, or the same reference numerals plus "H" to omit repetition of explanation.

The positioning apparatus 1H according to the ninth embodiment fully opens circular openings of through holes 35H and 37H at the surface of a stage 5H with circumferences of the through holes 35H and 37H being in contact with stop faces 21H and 23H of a stop unit 7H, respectively.

The ninth embodiment provides the same effect as the preceding embodiments.

Although the present invention has been explained with reference to the embodiments, these embodiments do not limit the present invention but allow various modifications.

For example, the number of the through holes formed through the stage 5 is optional. The through hole of the seventh embodiment is also applicable to the first to sixth, eighth, and ninth embodiments. The stop unit 7 of the first embodiment having a gap at the corner 33 is also applicable to the third to ninth embodiments. The stop unit 7G of the eighth embodiment having the recesses 61 and 63 are also applicable to the first to fourth, sixth, and seventh embodiments.

What is claimed is:

1. A positioning apparatus comprising:
   a stage having a surface that is flat and on which a thin plate-like object is set, the plate-like object being a piezoelectric element having a shape that is quadrangle and is to be attached to an attaching part of a head suspension, the stage's surface having a first area within which the piezoelectric element is roughly positioned and a second area within which the piezoelectric element is positioned at a target position corresponding to the attaching part;
   a stop unit receiving the piezoelectric element set on the stage in a planar direction of the piezoelectric element along the surface of the stage so that the piezoelectric element is positioned at the target position in the second area of the surface; and
   a pushing unit that blows a gas to push the piezoelectric element toward the stop unit in the planar direction so that the piezoelectric element slides on the stage; and
   wherein the stop unit has two stop faces corresponding to adjacent two sides of an outer periphery of the piezoelectric element;
   wherein the pushing unit has a single nozzle opening oriented in the planar direction toward a corner area between the two stop faces, so that the nozzle opening faces two side faces at an outer periphery of the piezoelectric element, said two side faces being distal to said corner area when the piezoelectric element is roughly positioned in the first area of the stage; and
   wherein the pushing unit blows the gas through the single nozzle opening toward the corner area between the two stop faces, whereby the blown gas hits said two end faces of the piezoelectric element that is roughly positioned in the first area of the stage and enters under the roughly-positioned piezoelectric element to slide the roughly-positioned piezoelectric element toward the target position in the second area.

2. The positioning apparatus of claim 1, wherein the piezoelectric element is square in a plan view, and the nozzle blows the gas in a direction inclined by 45° with respect to the two stop faces.

3. The positioning apparatus of claim 1, wherein the pushing unit is configured to be movable back and forth to adjust blowing force of the gas.

4. The positioning apparatus of claim 1, wherein the pushing unit is configured to control a flow rate of the gas to adjust blowing force of the gas.

5. The positioning apparatus of claim 1, further comprising:
   a through hole formed through the stage;
   a flow measurement unit configured to draw air through the through hole from around the piezoelectric element and measure a flow rate of the drawn air; and
   the positioning apparatus determining a positioning state of the piezoelectric element according to the measured flow rate.

6. The positioning apparatus of claim 5, wherein the through hole has an opening at the surface of the stage, the opening being partially covered by the stop unit and the opening being partially open at the stage surface, wherein a border of the partially open opening at the stage's surface is an arc extending away from the stop unit along the stage's surface.

7. The positioning apparatus of claim 6, wherein the shape of the opening of the through hole protruding from the stop face is semicircular.

8. The positioning apparatus of claim 5, wherein a plurality of the through holes are formed along the two stop faces.

9. The positioning apparatus of claim 5, wherein the through hole is formed at the corner between the two stop faces.

10. An apparatus for positioning a piezoelectric element at a target position from which the piezoelectric element is attachable to an attaching part of a head suspension, comprising:
- a stage having a surface that is flat and on which the piezoelectric element, which has a quadrangle shape, is received, the stage's surface having a first area within which the piezoelectric element is roughly positioned and having a second area within which the piezoelectric element is finely positioned at the target position;
- a first stop element configured to block movement of the piezoelectric element on the stage in a first planar direction along the surface of the stage, wherein the first stop element has a first stop face for abutting a first side face of the piezoelectric element while in the target position;
- a second stop element configured to block movement of the piezoelectric element on the stage in a second planar direction along the surface of the stage, wherein the second stop element has a second stop face for abutting a second side face of the piezoelectric element while in the target position, the first stop face being spaced from the second stop face by a gap; and
- a pushing unit having a single nozzle configured to emit a gas in a direction parallel to the stage surface at a force for pushing the piezoelectric element along the stage surface toward the first stop element and the second stop element, said nozzle being positioned off the stage and being aimed in said parallel direction; and
- wherein the piezoelectric element is located between the gap and the nozzle while within the first area and while within the second area; and
- wherein the blown gas hits a third side face and a fourth side face of the piezoelectric element to move the roughly-positioned piezoelectric element to the target position.

11. The apparatus of claim 10, wherein the nozzle is aimed toward the gap.

* * * * *